(12) United States Patent
Luo et al.

(10) Patent No.: US 9,166,838 B1
(45) Date of Patent: Oct. 20, 2015

(54) REFERENCE VOLTAGE GENERATION AND CALIBRATION FOR SINGLE-ENDED SIGNALING

(71) Applicant: Rambus Inc., Sunnyvale, CA (US)

(72) Inventors: Lei Luo, Chapel Hill, NC (US); Barry W. Daly, Chapel Hill, NC (US); Kambiz Kaviani, Palo Alto, CA (US); John Cronan Eble, III, Chapel Hill, NC (US); John Wilson, Wake Forest, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/489,814

(22) Filed: Sep. 18, 2014

Related U.S. Application Data

(63) Continuation of application No. 13/913,743, filed on Jun. 10, 2013, now Pat. No. 8,867,595.

(60) Provisional application No. 61/663,981, filed on Jun. 25, 2012.

(51) Int. Cl.
*H03K 9/00* (2006.01)
*H04L 27/06* (2006.01)
*H04L 25/06* (2006.01)
*H03K 3/013* (2006.01)
*H04L 25/08* (2006.01)

(52) U.S. Cl.
CPC ............... *H04L 25/06* (2013.01); *H03K 3/013* (2013.01); *H04L 25/08* (2013.01)

(58) Field of Classification Search
CPC ......... H03K 3/013; H04L 25/08; H04L 25/06
USPC .......................................... 375/316, 318, 319
See application file for complete search history.

(56) References Cited

U.S. PATENT DOCUMENTS

| | | | |
|---|---|---|---|
| 5,180,929 A * | 1/1993 | Kokubun | 327/50 |
| 5,262,999 A * | 11/1993 | Etoh et al. | 365/226 |
| 6,205,172 B1 | 3/2001 | Makinen | |
| 6,335,641 B1 * | 1/2002 | Tougou | 327/73 |
| 6,549,572 B1 | 4/2003 | Anderson et al. | |
| 6,665,624 B2 | 12/2003 | Simon et al. | |
| 6,876,248 B2 | 4/2005 | Nguyen et al. | |
| 7,093,145 B2 | 8/2006 | Werner et al. | |
| 7,163,276 B2 | 1/2007 | Silverbrook | |
| 7,236,894 B2 | 6/2007 | Oh et al. | |
| 7,308,044 B2 | 12/2007 | Zerbe et al. | |
| 7,602,859 B2 | 10/2009 | Cheng et al. | |
| 8,340,167 B2 | 12/2012 | Feng et al. | |
| 8,618,832 B2 * | 12/2013 | Li et al. | 326/30 |
| 8,634,452 B2 | 1/2014 | Zerbe et al. | |

(Continued)

*Primary Examiner* — Qutbuddin Ghulamali

(57) ABSTRACT

A signal on a transmitter tracks noise on a ground node in a manner decoupled from a positive node of a power supply. The signal is transmitted from the transmitter to the receiver. A reference voltage is generated on the receiver to track noise on a ground node in the receiver. Consequently, the received signal and the reference voltage have substantially the same noise characteristics, which become common mode noise that can be cancelled out when these two signals are compared against each other. In a further embodiment, the reference voltage is compared against a predetermined calibration pattern. An error signal is generated based on a difference between the sampler output and the predetermined calibration pattern. The error signal is then used to adjust the reference voltage so that the DC level of the reference voltage is positioned substantially in the middle of the received signal.

20 Claims, 5 Drawing Sheets

(56) References Cited

U.S. PATENT DOCUMENTS

| | | |
|---|---|---|
| 8,705,663 B2 | 4/2014 | Xu |
| 2009/0245424 A1* | 10/2009 | Osaka et al. .................. 375/316 |
| 2010/0253406 A1* | 10/2010 | Seefeldt et al. ............... 327/161 |
| 2011/0026570 A1 | 2/2011 | Feng et al. |
| 2011/0128992 A1 | 6/2011 | Maeda et al. |
| 2011/0254644 A1 | 10/2011 | Nutt |
| 2012/0155526 A1 | 6/2012 | Ware et al. |

* cited by examiner

REFERENCE VOLTAGE GENERATION AND CALIBRATION FOR SINGLE-ENDED SIGNALING

This disclosure claims priority to U.S. patent application Ser. No. 13/913,743, filed Jun. 10, 2013 on behalf of inventors Lei Luo, Barry W. Daly, Kambiz Kaviani, John Cronan Eble III, and John Wilson for "Reference Voltage Generation And Calibration For Single-Ended Signaling," which in turn claims priority to U.S. Provisional Application No. 61/663,981, filed on Jun. 25, 2012, also on behalf of inventors Lei Luo, Barry W. Daly, Kambiz Kaviani, John Cronan Eble III, and John Wilson for Reference Voltage Generation And Calibration For Single Ended Signaling. The aforementioned patent applications are incorporated herein by reference.

TECHNICAL FIELD

The disclosed embodiments generally relate to generating a fixed reference voltage in a single-ended signaling system. More specifically, the disclosed embodiments relate to techniques for both calibrating a DC level and reducing noise effects for the reference voltage in a single-ended signaling system.

BACKGROUND

In a single-ended signaling system, a transmitter generates a single voltage signal which is transmitted to a receiver, wherein the voltage signal is subsequently compared against a fixed reference voltage which is typically generated on the receiver or transmitted from transmitter to receiver. Note that the quality of this reference voltage can directly affect the voltage margin (e.g., the swing at the receiver input) of the receiver, which has direct impact on the timing margin and thus the data rate of the single-ended signaling system. Hence, for high-speed, high-performance operations in a single-ended signaling system, it is necessary to generate a high-quality reference voltage on the receiver, which involves producing an accurate DC level and a proper AC noise characteristic.

However, generating a high-quality reference voltage with both an accurate DC level and a proper AC noise characteristic can be challenging. From the "accurate DC level" aspect, the accuracy in the DC level of the reference voltage can suffer from DC offsets arising from circuit mismatches between the transmitter and the receiver, as well as intrinsic DC offsets within the amplifier and sampling circuits on the receiver. From the "proper AC noise characteristic" aspect, the challenge lies in that the reference voltage has to include an AC noise spectrum that is capable of offsetting a corresponding AC noise spectrum in the received signal. More specifically, the reference voltage can be coupled to both a positive node (referred to as "$V_{dd}$") and a ground node (referred to as "$V_{ss}$") of a power supply on the receiver, wherein $V_{dd}$ and $V_{ss}$ may have different noise spectrum. Moreover, the single-ended signal generated on the transmitter can also be coupled to noises in both $V_{dd}$ and $V_{ss}$ of a power supply on the transmitter. Because the noise spectrum in the $V_{dd}$ on the transmitter may be different from the noise spectrum in the $V_{dd}$ on the receiver, and the noise spectrum in the $V_{ss}$ on the transmitter may be different from the noise spectrum in the $V_{ss}$ on the receiver, it is extremely difficult to accurately track the AC noises in the single-ended signal using the intrinsic AC noises in the reference voltage.

DETAILED DESCRIPTION

The disclosed embodiments relate to techniques for generating a high-quality reference voltage on a receiver of a single-ended signaling system, wherein the reference voltage is compared against a signal received from a transmitter of the single-ended signaling system.

In some embodiments, techniques for reducing noise effects on a reference voltage generated on the receiver are described. In one embodiment, a signal which is generated on the transmitter is coupled to a ground node of a power supply on the transmitter so that the signal tracks a noise associated with the ground node. This signal is also decoupled from a positive node of the power supply on the transmitter so that the signal is isolated from a noise associated with the positive node. The signal is transmitted from the transmitter to the receiver, wherein the received signal is isolated from noise on the positive nodes of power supplies on both the transmitter and the receiver. Moreover, a reference voltage is generated on the receiver such that the reference voltage also tracks the noise on the ground node of the power supply while isolated from the noise on the positive node of the power supply on the receiver. Consequently, the received signal and the reference voltage have substantially the same noise characteristics, which become common mode noise that can be cancelled out when the two signals are compared on the receiver.

In further embodiments, techniques for calibrating a DC value (also referred to as a "DC level" in this disclosure) of a reference voltage generated on the receiver are described. In a specific embodiment, a calibration process uses only receiver-side circuits to calibrate the reference voltage in a number of steps. More specifically, the reference voltage is compared against a received signal comprising a predetermined calibration pattern on the receiver. A sampler samples the difference between the reference voltage and the received signal, and a calibration controller generates an error signal based on the sampler output and the predetermined calibration pattern. In one calibration step, the error signal is used to adjust a set of offset bits to compensate for DC offsets in the sampler. In another calibration step, the error signal is used to adjust the reference voltage so that the DC level of the reference voltage is positioned substantially in the middle of the received signal.

In the discussion below, the term "noise" refers to AC noise at frequencies that are above DC level. Moreover, the terms "DC level" and "DC value" are used interchangeably to refer to the DC component in the reference voltage.

Figure 1:
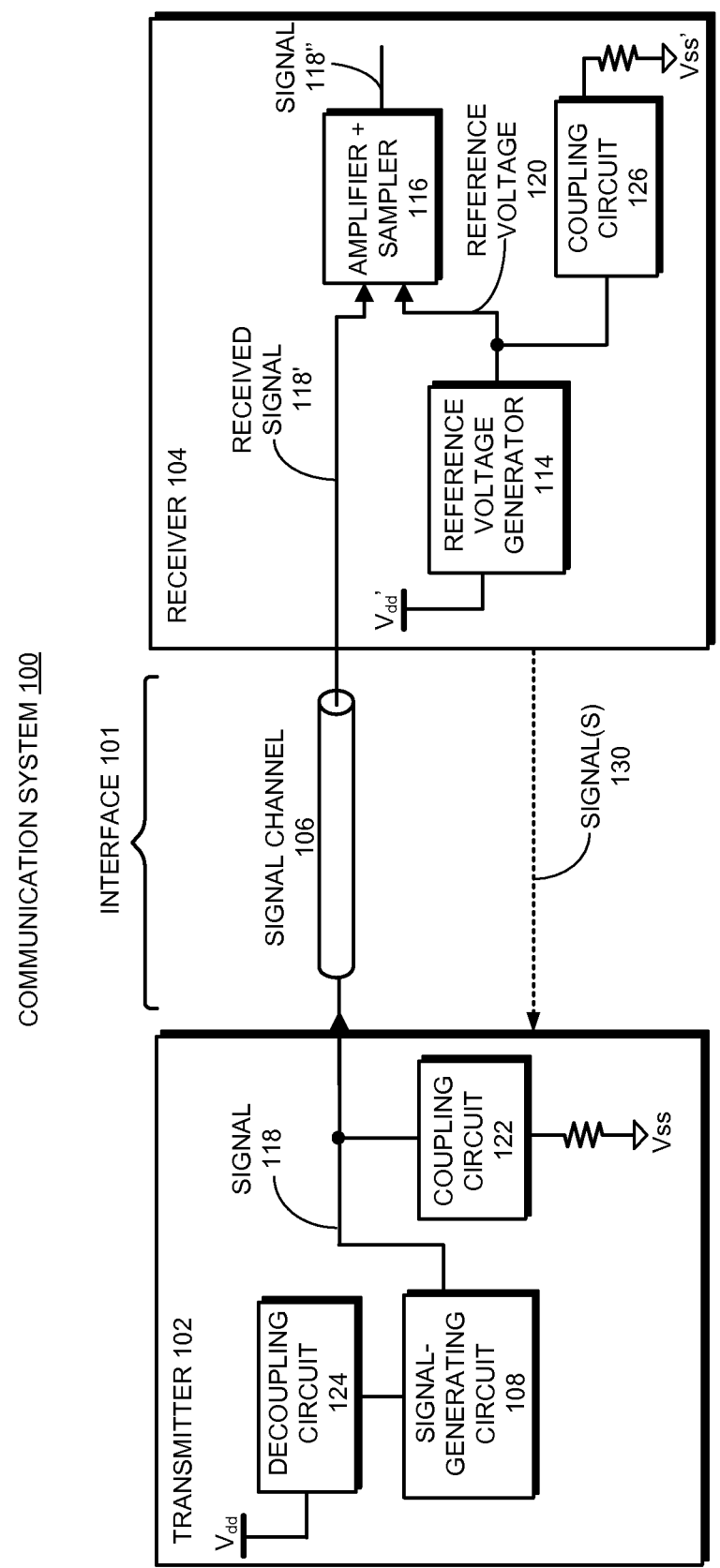
FIG. 1 presents a high-level block diagram illustrating a single-ended communication system which uses a receiver-side reference voltage to compare against a received voltage signal.

FIG. 1 presents a high-level block diagram illustrating a single-ended communication system 100 which uses a receiver-side reference voltage to compare against a received voltage signal. As illustrated in FIG. 1, communication system 100 includes a transmitter 102 (such as a memory controller), a receiver 104 (such as a memory device), and an interface 101 coupled between transmitter 102 and receiver 104, wherein interface 101 further includes a signal channel 106. Moreover, transmitter 102 can further include a signal-generating circuit 108, while receiver 104 can further include a reference voltage generator 114 and an amplifier/sampler 116.

During data signaling on communication system 100, signal-generating circuit 108 in transmitter 102 generates a signal 118, which is then transmitted over signal channel 106. Signal 118 is received by receiver 104 as a received signal 118'. In particular embodiments, signal 118 (and hence signal 118') is a single-ended voltage signal which is referenced to a ground level. For example, this ground level can be a ground node of a power supply, illustrated as $V_{ss}$ in FIG. 1.

In some embodiments, transmitter 102 is configured in a way so that signal 118 will include the noise in $V_{ss}$ (referred to as "$V_{ss}$ noise") but is lack of the noise in a positive node $V_{dd}$ of the power supply on transmitter 102 (referred to as "$V_{dd}$ noise"). As a result, received signal 118' also includes $V_{ss}$ noise but lack of transmitter $V_{dd}$ noise. To resolve/recover original signal 118 on receiver 104, signal 118' is compared against a reference voltage 120 generated by reference voltage generator 114, as illustrated in FIG. 1, and the difference between the two signals is sampled by amplifier+sampler 116. In some embodiments, both signal 118' and reference voltage 120 are referenced to a ground node of a power supply, illustrated as $V_{ss}'$ in FIG. 1. While ground node $V_{ss}$ on transmitter 102 and ground node $V_{ss}'$ on receiver 104 may not necessarily be the same node, they can be made to have substantially the same DC level and substantially the same noise characteristics. This can be achieved by a well-established electrical connection between the two nodes. In some embodiments, ground node $V_{ss}$ on transmitter 102 and ground node $V_{ss}'$ on receiver 104 can be the same node. Ideally, amplifier+sampler 116 outputs signal 118" which is an exact copy of signal 118. However, the quality of reference voltage 120 can directly affect the accuracy of signal 118", which can be affected by various noises associated with receiver signal 118' and reference voltage 120, as well as various DC offsets associated with amplifier/sampler 116.

Note that transmitter 102 also includes a coupling circuit 122 between signal 118 and $V_{ss}$ for coupling signal 118 to $V_{ss}$, so that signal 118 tracks the $V_{ss}$ noise. Moreover, transmitter 102 includes a decoupling circuit 124 between signal-generating circuit 108 and $V_{dd}$ for decoupling signal 118 from $V_{dd}$, so that signal 118 is isolated from the $V_{dd}$ noise. In some embodiments, decoupling circuit 124 is an on-chip voltage regulator which is configured to generate a regulated voltage for signal-generating circuit 108, and to decouple signal-generating circuit 108, and hence signal 118 from $V_{dd}$ noise. More detail of circuits 122 and 124 is provided below.

Additionally, receiver 104 includes a coupling circuit 126 between reference voltage 120 and the ground node $V_{ss}'$ for coupling reference voltage 120 to $V_{ss}'$, so that reference voltage 120 tracks the noise associated with $V_{ss}'$ (referred to as "$V_{ss}'$ noise"). Also note that reference voltage generator 114 is coupled between reference voltage 120 and a positive node of the power supply $V_{dd}'$ to decouple reference voltage 120 from $V_{dd}'$, so that reference voltage 120 is also isolated from the noise associated with $V_{dd}'$ (referred to as "$V_{dd}'$ noise"). More detail of these circuits is provided below.

Note that in addition to the components illustrated in FIG. 1, transmitter 102 and receiver 104 may also include other components related to other functions. In some embodiments, receiver 104 further includes circuitries for initializing and calibrating amplifier/sampler 116, and for calibrating the DC level of reference voltage 120, which are described in more detail below. Moreover, although only a single signal 118 is shown being transmitted from transmitter 102 to receiver 104, in many cases there may be multiple signals transmitted from transmitter 102 to receiver 104, and communication system 100 may have multiple amplifiers/samplers for handling such multiple signals. Additionally, one or more signals may be transmitted from receiver 104 to transmitter 102, as indicated by the dashed arrow representing optional signal(s) 130.

Transmitter 102 and receiver 104 may be located on the same integrated circuit, or they can be located on different integrated circuits. In other embodiments, transmitter 102 and receiver 104 may be located on separate modules (e.g., separate cards) coupled by one or more buses.

Note that signal 118 may be a digital or analog signal, or any general signal capable of communicating information. In some embodiments, signal 118 is a digital signal associated with memory operations. In these embodiments, signal 118 can include read/write data, a control signal, an address signal, and a clock signal. In specific embodiments, this digital signal is a binary signal comprising 1's and 0's.

Tracking Noise in the Reference Voltage

Figure 2:
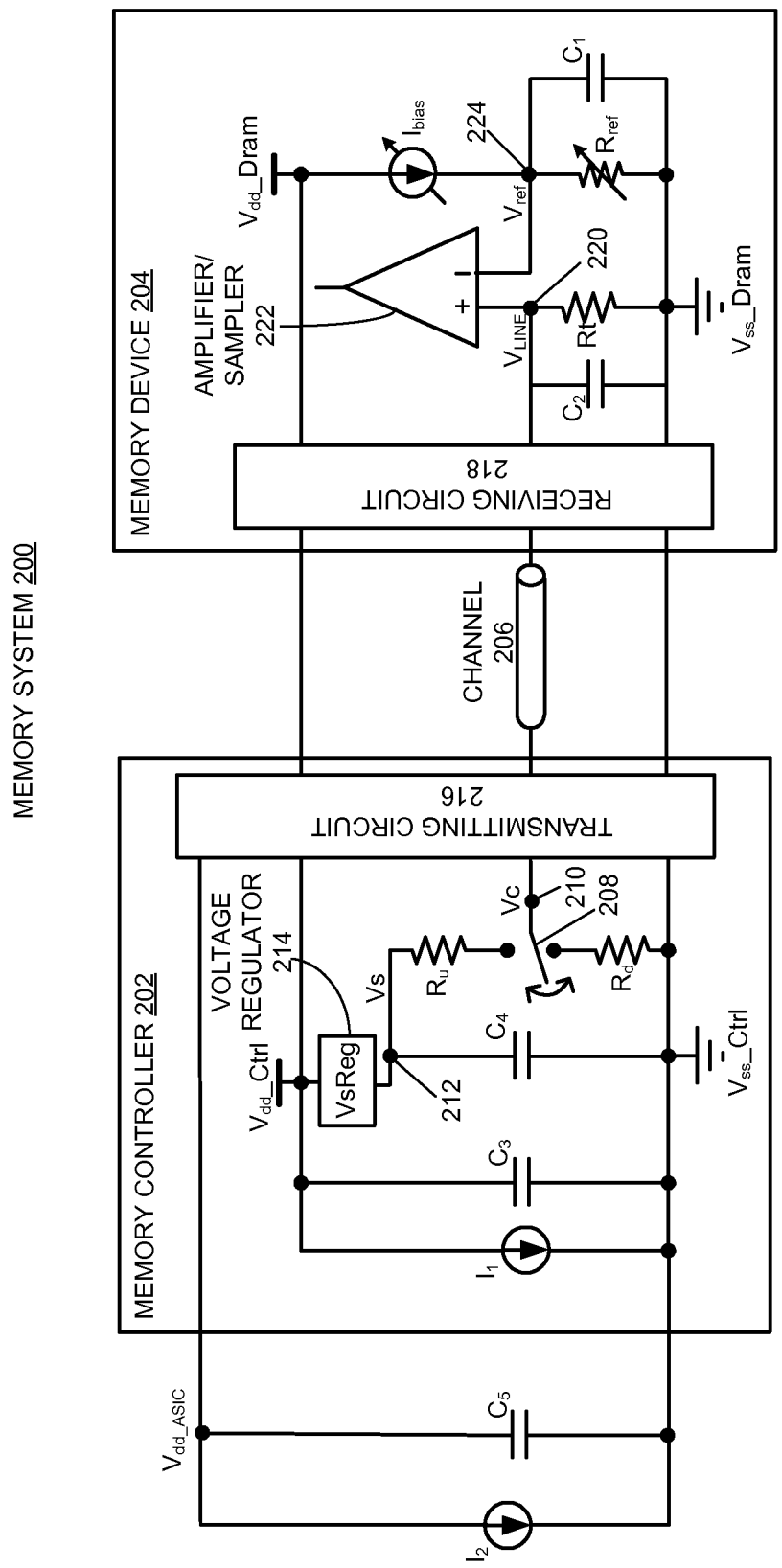
FIG. 2 illustrates a single-ended memory system which provides circuits for tracking noise in a reference voltage generated on the receiver side of the memory system.

FIG. 2 illustrates a single-ended memory system 200 which provides circuits for tracking noise in a reference voltage generated on the receiver side of memory system 200. Note that single-ended memory system 200 is an exemplary embodiment of single-ended communication system 100. However, any circuit and technique described in conjunction with memory system 200 is applicable to both memory system implementations and non-memory system implementations of communication system 100, and not limited to the specific embodiment of FIG. 2.

More specifically, memory system 200 includes a memory controller 202, a memory device 204, and a link 206 which act as transmitter 102, receiver 104, and signal channel 106, respectively. In some embodiments, memory device 204 is a dynamic random-access memory (DRAM) device. However, memory device 204 can include other types of memory devices. Note that circuit components in memory controller 202 receive power from a power supply having a positive node denoted as "$V_{dd}$_Ctrl." Moreover, some or all signals in memory controller 202, including the power supply, are referenced to the same ground node, denoted as "$V_{ss}$_Ctrl." We refer to such a signal configuration as "ground signaling."

Further referring to FIG. 2, resistance $R_u$, resistance $R_d$, and a switch 208 on memory controller 202 constitute a signal-generating circuit, such as signal-generating circuit 108 in FIG. 1. In the embodiment shown, a single-ended signal Vc is generated at node 210 which has a value determined by the position of switch 208. More specifically, when switch 208 is connected to the upper resistance $R_u$, signal Vc has a value substantially equal to Vs/2, wherein Vs is an on-chip generated voltage at node 212. On the other hand, when switch 208 is connected to the lower resistance $R_d$, signal Vc has a value substantially equal to the ground reference $V_{ss}$_Ctrl. Hence, signal Vc at node 210 can switch between $V_{ss}$_Ctrl, which represents "0" or LOW, and Vs/2, which represents "1" or HIGH. Note that a circuit for generating the single-ended signal Vc on controller 202 is not limited to the particular embodiment shown and many modifications and variations to the described circuit will be apparent to one of ordinary skill in the art.

In one embodiment, Vs is generated based on $V_{dd}$_Ctrl by a voltage regulator 214 which is coupled between $V_{dd}$_Ctrl and node 212. Voltage regulator 214 may be used to isolate Vs from noise associated with $V_{dd}$_Ctrl (or "$V_{dd}$_Ctrl noise"), thus acting as decoupling circuit 124 in FIG. 1. More detail of voltage regulator 214 is provided below. However, in some embodiments, Vs is generated externally to memory controller 202 and supplied to memory system 200.

As illustrated in FIG. 2, signal Vc is transmitted by a transmitting circuit 216 over channel 206, and received by a receiving circuit 218 on memory device 204 as a received signal $V_{LINE}$ at node 220, which is an input to an amplifier+sampler 222. In one embodiment, the path between nodes 210 and 220 is an absolutely "transparent" signal path, e.g., a wire, so that signal $V_{LINE}$ is substantially identical to signal Vc from DC to high frequencies. In this embodiment, signal $V_{LINE}$ and signal Vc have the same AC noise characteristics.

Also in memory device 204, an adjustable current source $I_{bias}$ and an adjustable resistance $R_{ref}$, which are coupled in series between a positive power supply node "$V_{dd}$_Dram" and a ground node "$V_{ss}$_Dram," constitute a reference voltage generating circuit, such as reference voltage generator 114 in FIG. 1. In the embodiment shown, a reference voltage $V_{ref}$ is generated at node 224 between current source $I_{bias}$ and resistance $R_{ref}$, wherein node 224 is a second input to amplifier+sampler 222. Hence, reference voltage $V_{ref}$ has a DC value determined by $V_{dd}$_Dram, $I_{bias}$, and $R_{ref}$, and can be controlled by adjusting $I_{bias}$. For example, $V_{ref}$ increases when $I_{bias}$ is increased, and decreases when $I_{bias}$ is decreased (assume $R_{ref}$ is unchanged). Note that the reference voltage generating circuit in memory device 204 is not limited to the particular embodiment shown, and many modifications and variations to the illustrated embodiment will be apparent to one of ordinary skill in the art.

Note that because node 224 is coupled between $V_{dd}$_Dram and $V_{ss}$_Dram, $V_{ref}$ can be corrupted by noises associated with both $V_{dd}$_Dram and $V_{ss}$_Dram (referred to as "$V_{dd}$_Dram noise" and "$V_{ss}$_Dram noise"). In one embodiment, current source $I_{bias}$ by design (which is partly due to its high impedance) decouples node 224 and hence $V_{ref}$ from $V_{dd}$_Dram noise at substantially all frequencies, thereby achieving noise isolation from $V_{dd}$_Dram in $V_{ref}$. Moreover, by providing a coupling capacitance $C_1$ between node 224 and $V_{ss}$_Dram, the embodiment of FIG. 2 allows $V_{ref}$ to exclusively track $V_{ss}$_Dram noise in the high-frequency range. For the low- to mid-frequency range, current source $I_{bias}$ has particularly high impedance by design which forces node 224 to strongly couple to $V_{ss}$_Dram (i.e., the ground). Consequently, node 224, and hence $V_{ref}$, can track $V_{ss}$_Dram noise in a full frequency range.

Ideally, $V_{LINE}$ and $V_{ref}$ have substantially the same noise characteristics; thus, the noises in both signals become common mode noise at the inputs of a differential amplifier in amplifier+sampler 222. This can be achieved in the embodiment of FIG. 2 if $V_{LINE}$ is also isolated from $V_{dd}$_Dram noise while exclusively tracking $V_{ss}$_Dram noise. In the embodiment illustrated in FIG. 2, $V_{LINE}$ can track $V_{ss}$_Dram noise through a coupling capacitance $C_2$ between node 220 and $V_{ss}$_Dram. However, $V_{LINE}$ is a received copy of Vc generated at node 210 in memory controller 202; therefore, any noise present in Vc can be copied into $V_{LINE}$. Consequently, to ensure that $V_{LINE}$ and $V_{ref}$ have the same noise characteristics, it is necessary to ensure that Vc also exclusively tracks noise in $V_{ss}$_Ctrl while being isolated from noise in $V_{dd}$_Ctrl.

Note that the above statement assumes that the noise spectra in $V_{ss}$_Ctrl and $V_{ss}$_Dram are identical. This result, however, is not automatic because $V_{ss}$_Ctrl noise and $V_{ss}$_Dram noise can be different. To ensure that they have the same noise characteristics, some embodiments provide low impedance coupling between $V_{ss}$_Ctrl and $V_{ss}$_Dram so that $V_{ss}$_Ctrl noise is substantially identical to $V_{ss}$_Dram noise. In one embodiment, $V_{ss}$_Ctrl and $V_{ss}$_Dram are directly coupled by a wire.

However, embodiments of this disclosure generally do not require the noise spectra in $V_{dd}$_Ctrl and $V_{dd}$_Dram to be identical, because the described embodiments ensure that signals Vc, $V_{LINE}$ and $V_{ref}$ are all decoupled from $V_{dd}$ noises. Generally, memory controller 202 and memory device 204 may work at different supply voltages (when ground referencing is assumed). In other words, $V_{dd}$_Ctrl and $V_{dd}$_Dram may be different in both DC values and noise characteristics. Note that because the design of memory system 200 has a high tolerance to power supply noise, a designer may take advantage of such a design to save system costs by allowing more supply noise.

We now describe techniques for making Vc track $V_{ss}$_Ctrl noise while being isolated from $V_{dd}$_Ctrl noise on memory controller 202. By design, when switch 208 is connected to $R_d$ (i.e., when Vc is LOW), tracking $V_{ss}$_Ctrl noise and isolation from $V_{dd}$_Ctrl noise can be simultaneously achieved in Vc at node 210. However, when switch 208 is connected to $R_u$ (i.e., when Vc is HIGH), additional features in the embodiment of FIG. 2 ensure that Vc tracks $V_{ss}$_Ctrl noise while isolated from $V_{dd}$_Ctrl noise. More specifically, $V_{dd}$_Ctrl noise can be represented as a noise current $I_1$ flowing from $V_{dd}$_Ctrl to $V_{ss}$_Ctrl (from a small signal perspective). Typically, a bypass circuit, such as a bypass capacitor $C_3$ coupled in parallel with noise current $I_1$, can reduce the $V_{dd}$_Ctrl noise generated due to noise current $I_1$ at high-frequency by coupling $V_{dd}$_Ctrl and $V_{ss}$_Ctrl. However, this bypass circuit becomes insufficient to reduce $V_{dd}$_Ctrl noise at a low- to mid-frequency range, in particular when near a DC level.

In one embodiment, voltage regulator 214 is configured to generate Vs as a low noise, regulated version of $V_{dd}$_Ctrl. In particular, voltage regulator 214 may employ a noise filter which specifically blocks $V_{dd}$_Ctrl noise in the low- to mid-frequency range. More details of voltage regulator 214 are provided in U.S. Patent Application No. 61/530,775, entitled "On-chip Regulator with Variable Load Compensation," by inventors Brian Leibowitz, Michael Bucher, Lei Luo, Charles Huang, Amir Amirkhany, and Huy Nguyen, filed on 2 Sep. 2011, which is hereby incorporated by reference. By combining bypass capacitor $C_3$ and voltage regulator 214, memory controller 202 generates Vs which is isolated from $V_{dd}$_Ctrl noise in a full frequency range. This ensures that Vc is isolated from $V_{dd}$_Ctrl noise when switch 208 is connected to $R_u$.

To ensure that Vs tracks $V_{ss}$_Ctrl noise when switch 208 is connected to $R_u$, an embodiment of memory controller 202 provides a coupling capacitor $C_4$ between node 212 and $V_{ss}$_Ctrl. Note that $C_4$ provides a low impedance path for high-frequency $V_{ss}$_Ctrl noise to be coupled into Vs, and thereby into Vc when Vc is HIGH.

Calibrating a DC Level for a Reference Voltage

Figure 3:
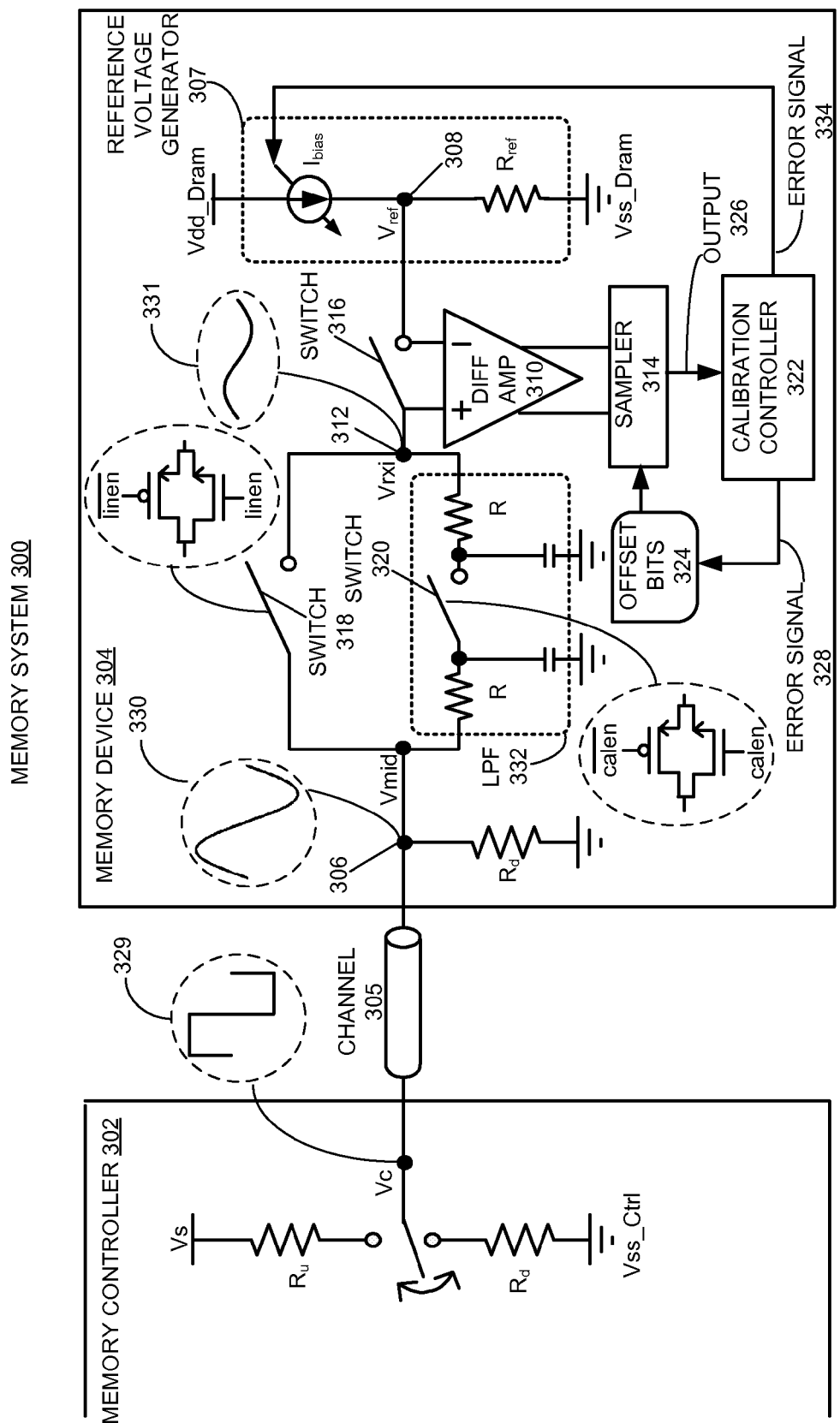
FIG. 3 illustrates a single-ended memory system which includes circuits for calibrating a DC level for a reference voltage generated on the receiver side of the memory system.

FIG. 3 illustrates a single-ended memory system 300 which includes circuits for calibrating a DC level for a reference voltage generated on the receiver side of memory system 300. Note that single-ended memory system 300 is an exemplary embodiment of single-ended communication system 100. However, any circuit and technique described in conjunction with memory system 300 is applicable to both memory system implementations and non-memory system implementations of communication system 100, but is not limited to the specific embodiment of FIG. 3.

As is illustrated in FIG. 3, a memory controller 302 in memory system 300 may be similar to memory controller 202 in FIG. 2, but only a circuit that generates signal Vc is shown within memory controller 302. Signal Vc is transmitted from memory controller 302 over channel 305, and received by a memory device 304 in memory system 300 as signal $V_{mid}$ at node 306.

Memory device 304 is similar to memory device 204 in FIG. 2, but includes additional circuits for calibrating a reference voltage generated on memory device 304. More specifically, memory device 304 includes a reference voltage generator 307 comprising a high-impedance current source $I_{bias}$ with a variable current and a resistance $R_{ref}$ coupled between $V_{dd\_}$Dram and $V_{ss\_}$Dram, wherein a reference voltage $V_{ref}$ is produced at node 308 between $I_{bias}$ and $R_{ref}$. A differential amplifier (diff amp) 310 compares a first input coupled to $V_{ref}$ against a second input coupled to signal $V_{rxi}$ at node 312, and generates differential outputs which are fed into a sampler 314. Hence, differential amplifier 310 and sampler 314 form a data recovery circuit which may act as the amplifier+sampler 222 in FIG. 2. Note that while FIG. 3 illustrates a differential output scheme for differential amplifier 310, other embodiments can also use a single-ended output scheme.

Moreover, memory device 304 includes calibration circuits for calibrating a DC level for reference voltage $V_{ref}$. In one embodiment, these calibration circuits include a set of switches: switch 316 coupled between nodes 308 and 312, switch 318 coupled between nodes 306 and 312 in a first path, and switch 320 coupled between nodes 306 and 312 in a second path. The calibration circuits also include a calibration controller 322 which can control the states of the set of switches by selectively opening or closing each of the switches (the coupling between calibration controller 322 and the set of switches is not explicitly shown but is assumed). In one embodiment, switches 316, 318 and 320 are implemented as parallel PMOS/NMOS switches. For example, a parallel PMOS/NMOS switch controlled by a control bit "linen" and a parallel PMOS/NMOS switch controlled by a control bit "calen" are shown in FIG. 3 as implementations for switches 318 and 320, respectively. In this embodiment, calibration controller 322 can control the states of the switches by controlling the respective control bits. Note that other embodiments can use different switch types from the parallel PMOS/NMOS switches.

We now describe a calibration process which includes a sequence of calibration steps that are controlled by calibration controller 322. More specifically, calibration controller 322 controls the calibration process by controlling the states of the set of switches, wherein each switch is configured to be open or closed at a given step of the calibration process.

The calibration process begins by performing an initial calibration of sampler 314 when switch 316 is closed while switches 318 and 320 are open. Note that by opening switches 318 and 320, sampler 314 is isolated from input signal $V_{mid}$. Moreover, closing switch 316 shorts nodes 308 and 312 so that both inputs to differential amplifier 310 become $V_{ref}$. As a result, the output of sampler 314 depends on DC offsets intrinsic to differential amplifier 310 and sampler 314, but not on either $V_{mid}$ or $V_{ref}$. Hence, during the first calibration step, sampler 314 is calibrated to compensate for such offsets. In one embodiment, sampler 314 can be calibrated by adjusting a string of offset bits 324. A particular setting of offset bits 324 can be used as a correction input to compensate for the offsets associated with sampler 314. This calibration step can be controlled by calibration controller 322 in a control loop comprising sampler 314, calibration controller 322, and adjustable offset bits 324. During calibration, calibration controller 322 receives sampler output 326 and generates an error signal 328 based on output 326. In one embodiment, error signal 328 is generated by comparing output 326 against a predetermined pattern which contains substantially equal numbers of 1's and 0's, for example, a 101010 pattern. The calibration can be iterative until calibration controller 322 determines that error signal 328 is below a predetermined threshold. Note that the calibration resolution may be affected by the number of bits in offset bits 324, and typically the higher the number of offset bits, the more accurate the calibration result becomes. At the end of the calibration, a significant portion of the offsets due to amplifier 310 and sampler 314 are compensated for.

After the initial sampler calibration, the calibration process proceeds to calibrate the DC level of $V_{ref}$ when switch 320 is closed while switches 316 and 318 are open. During this calibration step, a predetermined calibration pattern 329 is generated on controller 302 and transmitted to device 304. In one embodiment, calibration pattern 329 comprises substantially equal and even numbers of 1's and 0's. Such a calibration pattern has the advantage of minimizing duty-cycle effects during calibration, and enables using an interpolation technique for DC level calibration while avoiding the ripple effect within the pattern. This interpolation technique is described in more detail in conjunction with FIG. 4. In one embodiment, calibration pattern 329 comprises a "1100" pattern.

As illustrated in FIG. 3, calibration pattern 329 becomes calibration pattern 330 or $V_{mid}$ at node 306, and subsequently passes through a low pass filter (LPF) 332 and becomes $V_{rxi}$ at node 312. Because LPF 332 attenuates high frequency ripple in calibration pattern 330, the signal received at node 312 comprises primarily a DC level (e.g., Vs/2) and a low amplitude ripple (or a "residual ripple 331") of calibration pattern 330. Next, $V_{rxi}$ comprising the calibration pattern in the form of the residual ripple is compared against $V_{ref}$ by differential amplifier 310 and sampler 314. The $V_{ref}$ DC level calibration can also be controlled by calibration controller 322 in a control loop comprising reference voltage generator 307, differential amplifier 310, sampler 314, and calibration controller 322. During calibration, calibration controller 322 receives sampler output 326 and generates an error signal 334 based on output 326. Calibration controller 322 then uses error signal 334 to adjust $V_{ref}$ by varying $I_{bias}$ in reference voltage generator 307. The calibration can be iterative until calibration controller 322 determines that error signal 334 is below a predetermined threshold.

Figure 4:
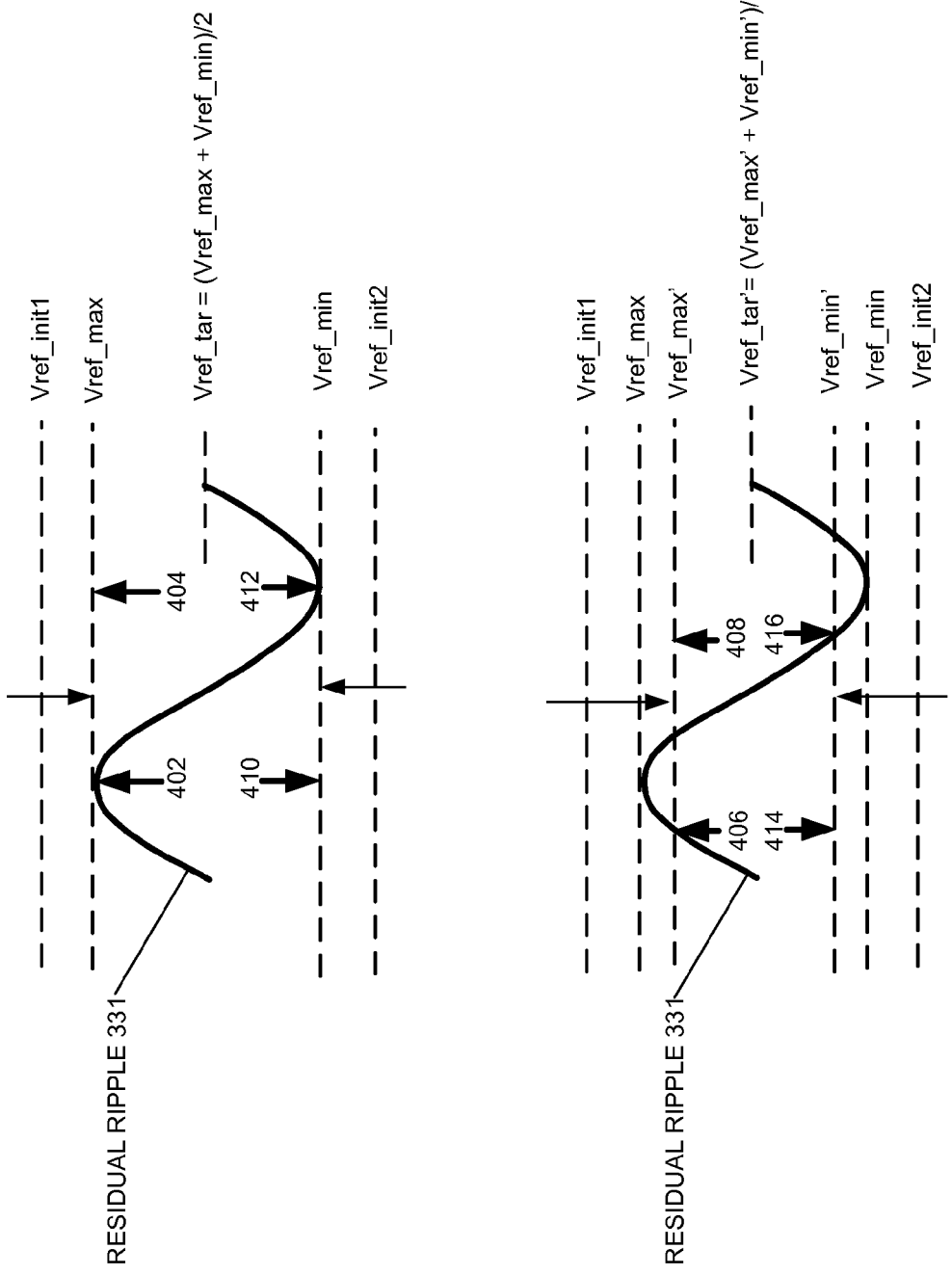
FIG. 4 illustrates an interpolation technique for calibrating a $V_{ref}$ DC level based on a residual ripple pattern.

FIG. 4 illustrates an interpolation technique for calibrating a $V_{ref}$ DC level based on residual ripple 331 at node 312. Note that FIG. 4 is described in the scope of memory device 304 in FIG. 3. We start at the upper part of FIG. 4, which illustrates an exemplary residual ripple 331 in a full period. Note that an ideal DC value of $V_{ref}$ is at midway between the maximum value (denoted as "$V_{ref\_}$max") and the minimum value (denoted as "$V_{ref\_}$min") of residual ripple 331. Hence, a target value of $V_{ref}$, denoted as "$V_{ref\_}$tar," can be computed as ($V_{ref\_}$max+$V_{ref\_}$min)/2. Therefore, calibration of $V_{ref}$ can be converted into calibrations of $V_{ref\_}$max and $V_{ref\_}$min. Note that these two calibrations can be performed in any order. Note that when a signal HIGH is represented by Vs/2 on memory controller 302, $V_{ref\_}$tar may be substantially equal to Vs/4.

Referring back to FIG. 3, note that the value of $V_{ref}$ at node 308 is adjusted by varying $I_{bias}$, such that decreasing $I_{bias}$ decreases the $V_{ref}$ value and increasing $I_{bias}$ increases the $V_{ref}$ value. Based on these notions, we refer back to FIG. 4.

In one embodiment, the calibration of $V_{ref\_max}$ first initializes $V_{ref}$ to be greater than the expected $V_{ref\_max}$ value, for example, as $V_{ref\_init1}$. Because the residual ripple is sufficiently reduced by the LPF 332, $V_{ref\_max}$ is typically only slightly greater than the value of Vs/2. Hence, $V_{ref\_init1}$ can be set to be reasonably higher than Vs/2. Based on the configuration of differential amplifier 310, this initial value of $V_{ref}$ would cause sampler 314 to output predominantly 0's.

Next, the calibration of $V_{ref\_max}$ begins to decrease $V_{ref}$ value from $V_{ref\_init1}$ by decreasing $I_{bias}$, which causes $V_{ref}$ to be lowered toward $V_{ref\_max}$. While doing so, the calibration process continues to monitor the sampler output pattern. Note that as long as $V_{ref}$ is greater than $V_{ref\_max}$, the sampler output pattern will not change significantly. However, when $V_{ref}$ is decreased to substantially equal $V_{ref\_max}$, the sampler output pattern may start to change. We look at two scenarios when $V_{ref}$ is decreased to $V_{ref\_max}$.

In the first scenario, the sampling times of sampler 314 are indicated in the upper part of FIG. 4 by arrows 402 and 404. Note that these sampling times almost coincide with the maximum and minimum locations of residual ripple 331. Hence, as soon as $V_{ref}$ is decreased to $V_{ref\_max}$, the sampler output pattern begins to change and any further decrease of $V_{ref}$ (i.e., by one uptick of $I_{bias}$) will cause the sampler output to reverse from predominantly 0's to predominantly 1's. At this point, the calibration process can record the $I_{bias}$ value and/or corresponding $V_{ref}$ as the determined $V_{ref\_max}$.

The second scenario is illustrated in the lower part of FIG. 4 which is a copy of the upper part of FIG. 4 but with different sampling positions indicated by arrows 406 and 408. In this scenario, the sampling positions are offset to the left of the maximum and minimum locations of residual ripple 331, wherein the value of $V_{ref}$ at which the sampling takes place is denoted as $V_{ref\_max}'$. Note that when $V_{ref}$ is first decreased to $V_{ref\_max}$, the sampler output pattern does not change as in the first scenario. Instead, $V_{ref}$ has to be further decreased until $V_{ref}$ substantially equals $V_{ref\_max}'$ when the sampler output begins to change. Similarly to the first scenario, any further decrease of $V_{ref}$ beyond $V_{ref\_max}'$ will cause the sampler output to reverse from predominantly 0's to predominantly 1's. At this point, the calibration process can record the $I_{bias}$ value and/or corresponding $V_{ref}$ as the determined $V_{ref\_max}'$.

Note that the calibration of $V_{ref\_min}$ may be performed in a substantially similar manner to the calibration of $V_{ref\_max}$ but in the reverse direction. More specifically, the calibration of $V_{ref\_min}$ can first initialize $V_{ref}$ to be less than the expected $V_{ref\_min}$ value. Referring back to the upper part of FIG. 4, note that the initial value of $V_{ref}$ is set to be $V_{ref\_init2}$. Based on the configuration of differential amplifier 310, this initial value of $V_{ref}$ would cause sampler 314 to output predominantly 1's.

Next, the calibration of $V_{ref\_min}$ begins to increase $V_{ref}$ value from $V_{ref\_init2}$ by increasing $I_{bias}$, which causes $V_{ref}$ to be raised toward $V_{ref\_min}$. While doing so, the calibration process continues to monitor the sampler output pattern. Note that as long as $V_{ref}$ is less than $V_{ref\_min}$, the sampler output pattern will not change significantly. However, when $V_{ref}$ is increased to substantially equal $V_{ref\_min}$, the sampler output pattern may start to change.

In the first scenario, the sampling positions of sampler 314 are indicated by arrows 410 and 412. Hence, as soon as $V_{ref}$ is increased to $V_{ref\_min}$, the sampler output pattern begins to change and any further increase of $V_{ref}$ (i.e., by one uptick of $I_{bias}$) will cause the sampler output to reverse from predominantly 1's to predominantly 0's. At this point, the calibration process can record the $I_{bias}$ value and/or corresponding $V_{ref}$ as the determined $V_{ref\_min}$.

The second scenario is again illustrated in the lower part of FIG. 4 which has sampling positions indicated by arrows 414 and 416. In this scenario, the sampling positions are again offset to the left of the maximum and minimum locations of residual ripple 331, wherein the value of $V_{ref}$ at which the sampling takes place is denoted as $V_{ref\_min}'$. Hence, $V_{ref}$ has to be increased beyond $V_{ref\_min}$ until $V_{ref}$ substantially equals $V_{ref\_min}'$ when the sampler output begins to change. Any further increase of $V_{ref}$ beyond $V_{ref\_min}'$ will cause the sampler output to reverse from predominantly 1's to predominantly 0's. At this point, the calibration process can record the $I_{bias}$ value and/or corresponding $V_{ref}$ as the determined $V_{ref\_min}'$.

Once $V_{ref\_max}$ (or $V_{ref\_max}'$) and $V_{ref\_min}$ (or $V_{ref\_min}'$) are calibrated, $V_{ref\_tar}$ ($V_{ref\_tar}'$) can be computed as the average of the two values. Note that the first and second scenarios of the sampling clock demonstrate that if the residual ripple pattern has a good linearity, then the final computed $V_{ref}$ DC level is always positioned in the middle of the residual ripple pattern with substantially the same value (i.e., $V_{ref\_tar}=V_{ref\_tar}'$), regardless of where the pattern is sampled. Furthermore, it is assumed that the original calibration pattern 329 comprises substantially equal and even numbers of 1's and 0's. Note that this interpolation technique of FIG. 4 has high tolerance to the residual ripple, which allows smaller capacitance and resistance to be used in LPF 332 to save chip real-estate.

Referring back to FIG. 3, after calibrating the $V_{ref}$ DC level, the calibration process performs a final calibration of sampler 314 using the calibrated $V_{ref}$ value at node 308 and the same switch configurations as the $V_{ref}$ calibration. This calibration step can also be controlled by calibration controller 322 which receives sampler output 326 and generates an error signal 328 based on output 326. In one embodiment, error signal 328 is generated by comparing output 326 against the predetermined calibration pattern. Error signal 328 is then used to adjust offset bits 324 in fine granularity (e.g., by only adjusting the least significant bits) to compensate for residual offsets associated with differential amplifier 310, sampler 314, and any other self-generated offset error. This calibration can be iterative until calibration controller 322 determines that error signal 328 is below a predetermined threshold. At the end of this calibration step, an even higher resolution of sampler 314 is obtained and the calibration process is complete.

Note that the above described calibration technique can be carried out exclusively on the receiver side of system 300, without collaboration from the transmitter side of system 300 (e.g., no need to send information back to the transmitter side). Moreover, the calibration technique improves the calibration range and resolution by using both the receiver front-end amplifier and samplers to calibrate the $V_{ref}$ DC level. More specifically, differential amplifier 310 and reference voltage generator 307 are initially used to correct the large $V_{ref}$ DC offset, and sampler 314 is then calibrated to correct the residual $V_{ref}$ DC offset in fine granularity and to correct the individual sampler's self-generated offset error. Note that although only one sampler is shown in system 300, the described technique is applicable to systems comprising multiple samplers.

Upon completing the calibration process, the system can enter the normal operation mode by closing switch 318 and opening switches 316 and 320. In one embodiment, calibration controller 322 can be deactivated during normal operation. Note that calibration controller 322 can activate a new calibration process periodically or under specific circumstances. In one embodiment, a calibration process is performed during system initialization.

Figure 5:
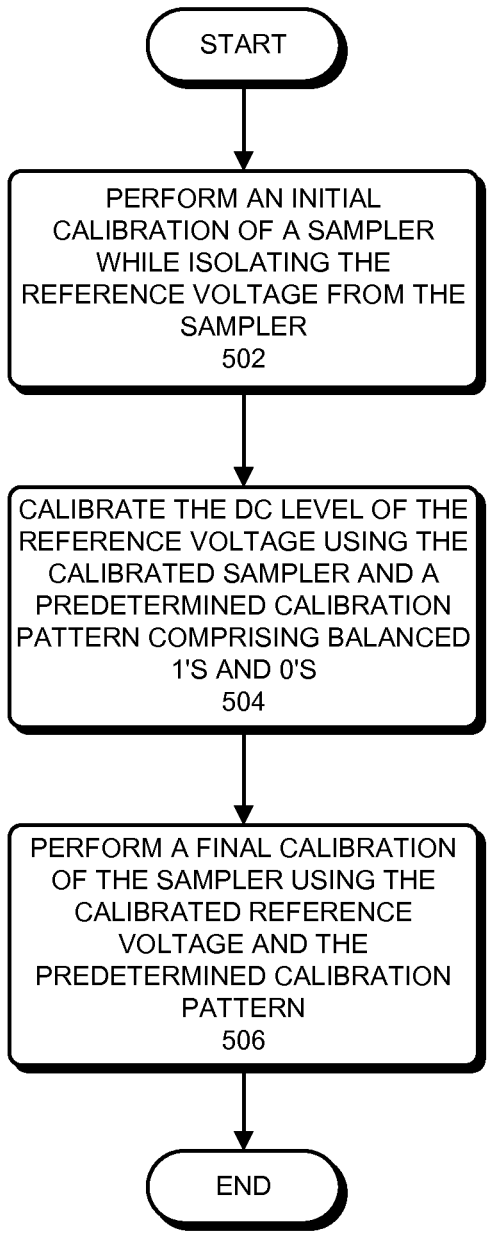
FIG. 5 presents a flowchart illustrating an exemplary process for calibrating the DC level of the reference voltage in a single-ended signaling system comprising a transmitter and a receiver.

FIG. 5 presents a flowchart illustrating an exemplary process for calibrating the DC level of the reference voltage in a single-ended signaling system comprising a transmitter and a receiver. The process begins by performing an initial calibration of a sampler on the receiver used to sample the difference between a received signal and the reference voltage being calibrated while isolating the reference voltage from the sampler (step 502). In one embodiment, this calibration step involves adjusting a string of offset bits associated with the sampler as described above. Note that if there are multiple samplers, step 502 can be repeated for each of the samplers. Next, the calibration process calibrates the DC level of the reference voltage using the calibrated sampler and a predetermined calibration pattern comprising balanced 1's and 0's (step 504). In one embodiment, this calibration step involves using the interpolation technique as described above. The calibration process then performs a final calibration of the sampler using the calibrated reference voltage and the same predetermined calibration pattern as in step 504 (step 506). In one embodiment, this calibration step involves fine-tuning the same string of offset bits associated with the sampler as described above.

Although the noise-tracking technique for a reference voltage and the DC level calibration technique for a reference voltage are described separately in conjunction with FIG. 3 and FIG. 4, these techniques and associated circuits can be combined into the same single-ended signaling system, such as a single-ended memory system. Such a system is capable of generating an accuracy reference voltage which is also immune to supply noise.

The above-described embodiments are applicable to different types of memory devices, for example, memory devices adhering to double data rate (DDR) standards, such as DDR2, DDR3, and DDR4, and future generations of memory devices, such as GDDR5, XDR, Mobile XDR, LPDDR, LPDDR2 and LPDDR3. However, these embodiments may differ in a number of respects, such as in the structure of the interface logic, the number of bank groups, and the number of memory banks within each bank group in a given memory device.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in, but are not limited to, application-specific integrated circuit (ASIC) chips, field-programmable gate arrays (FPGAs), and other programmable-logic devices.

We claim:

1. An integrated circuit, comprising:
   a reference voltage generator to generate a reference voltage; and
   a receiver to receive a single-ended signal, the receiver to generate a sequence of binary decisions from the single-ended signal as a result of comparison of the single-ended signal with the reference voltage according to timing defined by a sampling clock;
   wherein
   the receiver comprises a differential sampler having a first input, a second input, and an output, the first input to receive the single-ended signal, the second input to receive the reference voltage, and the output being dependent on a comparison of the first input with the second input,
   the integrated circuit is to, during a calibration mode, adjust operation of the differential sampler to output a neutral response when the first input and the second input are provided with a common voltage, and
   the integrated circuit further comprises circuitry to, during the calibration mode, adjust generation of the reference voltage by the reference voltage generator when the first input is provided with a predetermined calibration pattern carried by the single-ended signal, to cause the differential sampler to output a balanced set of binary decisions.

2. The integrated circuit of claim 1, wherein:
   the integrated circuit is to receive a ground input;
   the reference voltage generator is configured to generate the reference voltage relative to the ground input; and
   the integrated circuit is to capacitively couple the reference voltage to the ground input.

3. The integrated circuit of claim 1, embodied as a dynamic random access memory (DRAM) device, wherein the DRAM device comprises instances of said receiver, each instance to receive a respective single-ended signal from a memory controller.

4. The integrated circuit of claim 1, wherein the integrated circuit is a first integrated circuit and is to receive the single-ended signal from a second integrated circuit.

5. The integrated circuit of claim 1, wherein the circuitry to adjust the generation of the reference voltage is to identify during the calibration mode a maximum reference voltage, a minimum reference voltage, and a level of the reference voltage to be used in a normal operating mode, the level of the reference voltage to be used in the normal operating mode dependent on the identified maximum reference voltage maximum and the identified minimum reference voltage.

6. The integrated circuit of claim 1, wherein said integrated circuit further comprises circuitry to selectively short the first input to the second input during the calibration mode and, while the first input is shorted to the second input and the first input and the second input are provided with the common voltage, to adjust the operation of the differential sampler to output the neutral response.

7. The integrated circuit of claim 6, wherein the integrated circuit comprises circuitry to adjust operation of the differential sampler at least twice during the calibration mode, including at a first time, to cause the differential sampler to output the neutral response when the first input and the second input are provided with the common voltage, the first time prior to adjustment of the generation of the reference voltage by the reference voltage generator in the presence of the predetermined calibration pattern, and at a second time, to fine-tune the control input to cause the differential sampler to output the balanced set of binary decisions, the second time following adjustment of the generation of the reference voltage by the reference voltage generator in the presence of the predetermined calibration pattern and following identification of a level of the referenced voltage to be applied in a normal operating mode.

8. A system, comprising:
signal paths, each carrying a respective single-ended signal;
for each signal path, a transmitter to transmit the respective single-ended signal;
for each signal path, a receiver to receive the respective signal-ended signal, each receiver to generate a sequence of binary decisions from the respective single-ended signal as a result of comparison of the respective single-ended signal with a reference voltage, according to timing defined by a sampling clock, wherein all of said receivers are collocated in a single integrated circuit;
reference voltage generation circuitry to generate the reference voltage for each receiver;
wherein each receiver comprises a differential sampler having a first input, a second input, and an output,
wherein for each one of the receivers, during a normal operating mode, the first input is coupled to receive the respective single-ended signal, the second input is coupled to receive the reference voltage for the respective receiver, and the output is dependent on a comparison of the respective first input with the respective second input;
wherein the single integrated circuit is to, during a calibration mode, adjust the differential sampler for each receiver to cause the output to provide a neutral response when the respective first and second inputs are provided with a common voltage; and
wherein the integrated circuit further comprises circuitry to, during the calibration mode, cause the reference voltage generation circuitry to adjust reference voltage generation for each receiver such that the differential sampler of the respective receiver outputs a balanced set of binary decisions in dependence on a predetermined calibration pattern carried by the respective single-ended signal.

9. The system of claim 8, wherein the single integrated circuit is a first integrated circuit, wherein said system comprises a second integrated circuit, and wherein all of said transmitters are collocated on the second integrated circuit.

10. The system circuit of claim 9, wherein:
each of the first integrated circuit and the second is to receive a common ground input;
the reference voltage generation circuitry is to generate each reference voltage relative to the ground input; and
the second integrated circuit further comprises means for generating each of the single-ended signals relative to the common ground input.

11. The system of claim 10, wherein the first integrated circuit is embodied as a dynamic random access memory (DRAM) device, and wherein the second integrated circuit is embodied as a memory controller.

12. The system of claim 8, wherein all of said transmitters are also collocated on the single integrated circuit and wherein each of the single-ended signals is to be generated relative to ground.

13. The system of claim 8, wherein the circuitry to adjust reference voltage generation is to, during the calibration mode, for each of the receivers, identify a maximum reference voltage, identify a minimum reference voltage, and identify a level of a reference voltage to be used in a normal operating mode, dependent on the identified maximum reference voltage and the identified minimum reference voltage.

14. The system of claim 8, wherein the sampling clock for each receiver is to have a frequency of oscillation that is at least twice a frequency of logic level change in the predetermined calibration pattern carried by the respective single-ended signal.

15. The system of claim 14, wherein said system further comprises means for controlling at least one of the transmitters so as to generate the predetermined calibration pattern so as to be a repeating "1100" pattern.

16. A dynamic random access memory (DRAM) integrated circuit, comprising:
reference voltage generation circuitry to generate at least one reference voltage; and
receivers, each receiver to receive a respective single-ended signal and to generate a sequence of binary decisions from the respective single-ended signal as a result of comparison of the respective single-ended signal with a reference voltage of the at least one reference voltage, according to timing defined by a sampling clock;
wherein each of the receivers comprises a differential sampler having a first input, a second input, and an output;
wherein for each of the differential samplers, the first input is to be coupled to receive the respective single-ended signal, the second input is to be coupled to receive a reference voltage of the at least one reference voltage, and the output is to be dependent on a comparison of the respective first input with the respective second input;
wherein the DRAM integrated circuit is further to, during a calibration mode, adjust the output of each of the differential samplers to provide a neutral response when the respective first and second inputs are provided with a common voltage; and
wherein the DRAM integrated circuit is further to, during the calibration mode, adjust the reference voltage provided to each receiver in the presence of a predetermined calibration pattern carried by the respective single-ended signal, to cause each of the receivers to output a balanced set of binary decisions.

17. The DRAM integrated circuit of claim 16, wherein:
the DRAM integrated circuit is to receive a ground input;
the reference voltage generation circuitry is to generate each reference voltage relative to the ground input; and
each reference voltage is to be capacitively-coupled to the ground input.

18. The DRAM integrated circuit of claim 17, wherein the DRAM integrated circuit is to receive each respective single-ended signal from a memory controller which is external to the DRAM integrated circuit.

19. The DRAM integrated circuit of claim 18, wherein the circuitry to adjust reference voltage generation is to identify, during the calibration mode, for each receiver, a maximum reference voltage, a minimum reference voltage, and a level of the reference voltage to be used in a normal operating mode, dependent on the identified maximum reference voltage and the identified minimum reference voltage.

20. The DRAM integrated circuit of claim 16, wherein the DRAM integrated circuit further comprises circuitry to selectively short, for each of the receivers, the first input of the respective differential sampler to the second input of the respective differential sampler during the calibration mode to provide the common voltage and, while the first input and the second input are so shorted, to adjust an operating point of the respective differential sampler to provide the neutral response.

* * * * *